(12) United States Patent
Chung et al.

(10) Patent No.: US 9,276,026 B1
(45) Date of Patent: Mar. 1, 2016

(54) IMAGE SENSOR AND MANUFACTURING METHOD THEREOF

(71) Applicant: Powerchip Technology Corporation, Hsinchu (TW)

(72) Inventors: Chih-Ping Chung, Hsinchu (TW); Chih-Hao Peng, Taoyuan (TW); Ming-Yu Ho, Taichung (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/807,905

(22) Filed: Jul. 24, 2015

(30) Foreign Application Priority Data

May 28, 2015 (TW) .............................. 104117152 A

(51) Int. Cl.
| | | |
|---|---|---|
| *H01L 31/062* | (2012.01) | |
| *H01L 31/113* | (2006.01) | |
| *H01L 27/146* | (2006.01) | |

(52) U.S. Cl.
CPC ...... *H01L 27/14605* (2013.01); *H01L 27/1463* (2013.01); *H01L 27/14621* (2013.01); *H01L 27/14625* (2013.01); *H01L 27/14636* (2013.01); *H01L 27/14645* (2013.01); *H01L 27/14685* (2013.01); *H01L 27/14689* (2013.01)

(58) Field of Classification Search
CPC .................. H01L 27/14605; H01L 27/14643; H01L 27/14685; H01L 27/14636; H01L 27/14645; H01L 27/14625; H01L 27/1463
See application file for complete search history.

(56) References Cited

U.S. PATENT DOCUMENTS

| | | | |
|---|---|---|---|
| 7,800,192 B2 | 9/2010 | Venezia et al. | |
| 2004/0180461 A1* | 9/2004 | Yaung ............... | H01L 27/14685 438/48 |
| 2006/0255372 A1* | 11/2006 | Patrick .............. | H01L 27/14609 257/225 |

OTHER PUBLICATIONS

Gambino et al., "CMOS image sensor with high refractive index lightpipe," International Electron Devices Meeting, Dec. 11-13, 2006, pp. 1-4.
Indukuri et al., "Three-dimensional integration of metal-oxide-semiconductor transistor with subterranean photonics in silicon," Applied physics letters, Mar. 21, 2006, pp. 121108-1-121108-3.

* cited by examiner

*Primary Examiner* — Thanh Y Tran
(74) *Attorney, Agent, or Firm* — Jianq Chyun IP Office

(57) ABSTRACT

A manufacturing method of an image sensor is provided. A substrate is provided, and the substrate includes a pixel array region. A plurality of openings is formed in the pixel array region of the substrate. A light guide region is formed in the substrate aside each of the openings, wherein a portion of the substrate is disposed between the light guide region and the opening, and the depth of the light guide region in the substrate is greater than the depth of the opening aside the light guide region in the substrate. Isolation structures are formed in the openings to define a plurality of pixel regions respectively located between two adjacent isolation structures in the pixel array region. A photosensitive region is formed in each of the pixel regions of the substrate. A conductive line layer is formed on each of the pixel regions of the substrate.

20 Claims, 5 Drawing Sheets

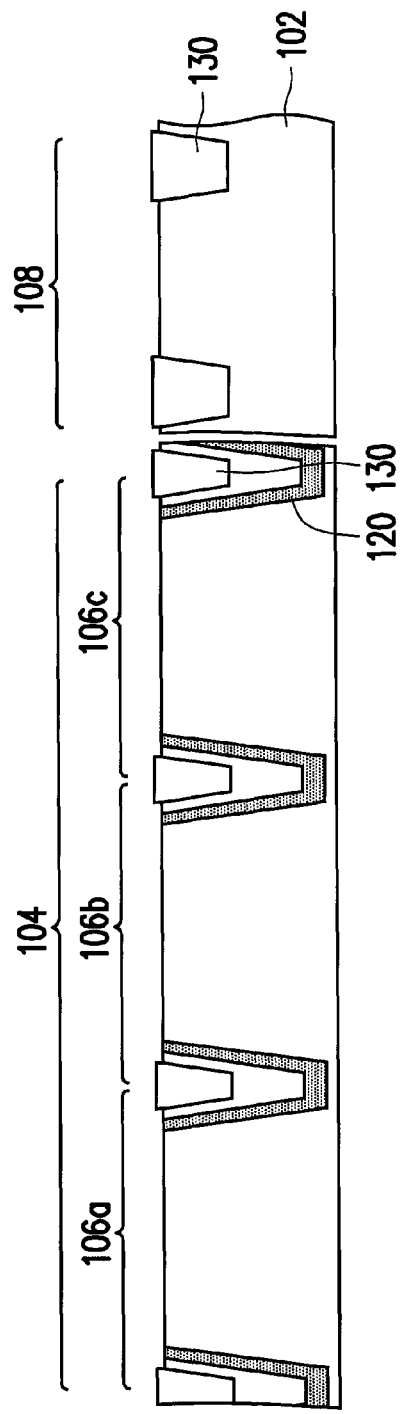
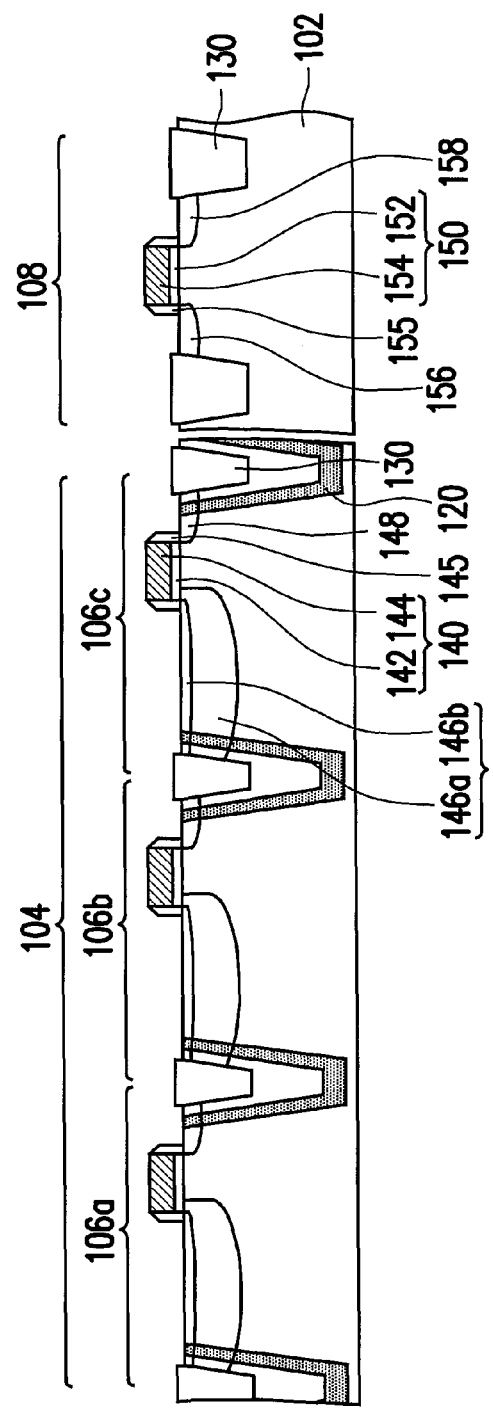

IMAGE SENSOR AND MANUFACTURING METHOD THEREOF

CROSS-REFERENCE TO RELATED APPLICATION

This application claims the priority benefits of Taiwan Patent Application No. 104117152, filed on May 28, 2015. The entirety of the above-mentioned patent application is hereby incorporated by reference herein and made a part of this specification.

BACKGROUND OF THE INVENTION

1. Field of the Invention

The invention relates to a semiconductor device and a manufacturing method thereof, and more particularly, to an image sensor and a manufacturing method thereof.

2. Description of Related Art

A complementary metal-oxide-semiconductor (CMOS) image sensor has a simple driving method and can implement a plurality of scanning methods, and is therefore extensively applied in imaging products such as security monitoring, digital cameras, toys, mobile phones, and video phones. In general, the image sensor includes a pixel array formed by the arrangement of a plurality of pixels, and each of the pixels is activated when receiving light. In the current trend of miniaturized image sensors, the spacing between pixels is reduced as a result. In this way, light incident to the image sensor generates severe optical scattering noise between pixels, that is, light originally to be received by a first color pixel may be received by a second color pixel due to light diffraction effect, thus causing the quantum efficiency (Q.E.) and the light sensitivity of each of the pixels to be worse, and causing the optical crosstalk between the pixels to be worse. Therefore, the spatial resolution and the overall sensitivity of the image sensor are reduced, and color mixing effect is generated, and therefore image noise is caused.

It can therefore be known that, in the current trend of miniaturized devices, how to increase the sensitivity of pixels under reduced size is one focus of study of various industries.

SUMMARY OF THE INVENTION

The invention provides an image sensor and a manufacturing method thereof capable of reducing optical crosstalk between pixels so as to increase the sensitivity and the quantum efficiency of the pixels.

A manufacturing method of an image sensor of the invention includes the following steps. A substrate is provided, and the substrate includes a pixel array region. A plurality of openings is formed in the pixel array region of the substrate. A light guide region is formed in the substrate aside each of the openings, wherein a portion of the substrate is disposed between the light guide region and the opening, and the depth of the light guide region in the substrate is greater than the depth of the opening aside the light guide region in the substrate. Isolation structures are formed in the openings to define a plurality of pixel regions respectively located between two adjacent isolation structures in the pixel array region. A photosensitive region is formed in each of the pixel regions of the substrate. A conductive line layer is formed on each of the pixel regions of the substrate.

In an embodiment of the invention, a method of forming the light guide region includes a separation by implanted oxygen method.

In an embodiment of the invention, the light guide region is formed in the substrate aside a sidewall and a bottom portion of the isolation structures.

In an embodiment of the invention, the light guide region is formed in the substrate aside a sidewall of the isolation structure.

An embodiment of the invention further includes forming a filter layer on a bottom surface of the substrate in each of the pixel regions, wherein the filter layer and the conductive line layer are located at two opposite sides of the substrate.

An embodiment of the invention further includes forming a filter layer on the conductive line layer of each of the pixel regions, wherein the filter layer and the substrate are located at two opposite sides of the conductive line layer.

In an embodiment of the invention, the substrate further includes a periphery region, wherein the periphery region is shielded when an implantation process is performed on the pixel array region to form the light guide regions.

In an embodiment of the invention, the photosensitive region is located between two adjacent conductive line layers.

In an embodiment of the invention, the index of refraction of the light guide region is less than the index of refraction of the substrate.

An image sensor of the invention includes a substrate, a plurality of isolation structures, a plurality of pixels, and a plurality of light guide regions. The substrate includes a pixel array region. The isolation structures are located in the substrate and define a plurality of pixel regions respectively located between two adjacent isolation structures in the pixel array region. The pixels are respectively located in the pixel regions. Each of the pixels includes a photosensitive region and a conductive line layer. The light guide region is located in the substrate aside the isolation structure, a portion of the substrate is disposed between the light guide region and the isolation structure, the depth of the light guide region in the substrate is greater than the depth of the isolation structure aside the light guide region in the substrate, and the index of refraction of the light guide region is less than the index of refraction of the substrate.

In an embodiment of the invention, the material of the light guide region includes silicon oxide.

In an embodiment of the invention, the light guide region is located aside a sidewall and a bottom portion of the isolation structure.

In an embodiment of the invention, the light guide region is located aside a sidewall of the isolation structure.

An embodiment of the invention further includes a filter layer located on a bottom surface of the substrate in each of the pixel regions, wherein the filter layer and the conductive line layer are located at two opposite sides of the substrate.

An embodiment of the invention further includes a filter layer located on the conductive line layer of each of the pixel regions, wherein the filter layer and the substrate are located at two opposite sides of the conductive line layer.

In an embodiment of the invention, the substrate further includes a periphery region, and the periphery region includes a plurality of isolation structures.

An embodiment of the invention further includes a gate structure located on the substrate in each of the pixel regions, wherein the photosensitive region and a floating drain region are located in the substrate at two sides of the gate structure.

In an embodiment of the invention, the photosensitive region is located between two adjacent conductive line layers.

In an embodiment of the invention, the conductive line layer further includes at least one conductive layer and at least one dielectric layer.

Based on the above, in the invention, the light guide region is formed in the substrate aside each of the isolation structures, and the light guide region can block light incident to a pixel from entering another pixel, so as to reduce optical crosstalk between the pixels. In this way, the sensitivity and the quantum efficiency of the pixels can be increased, such that the sensor has better spatial resolution and overall sensitivity.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 1F are cross-sectional schematics of the manufacturing method of an image sensor illustrated according to an embodiment of the invention.

DESCRIPTION OF THE EMBODIMENTS

Figure 1A:
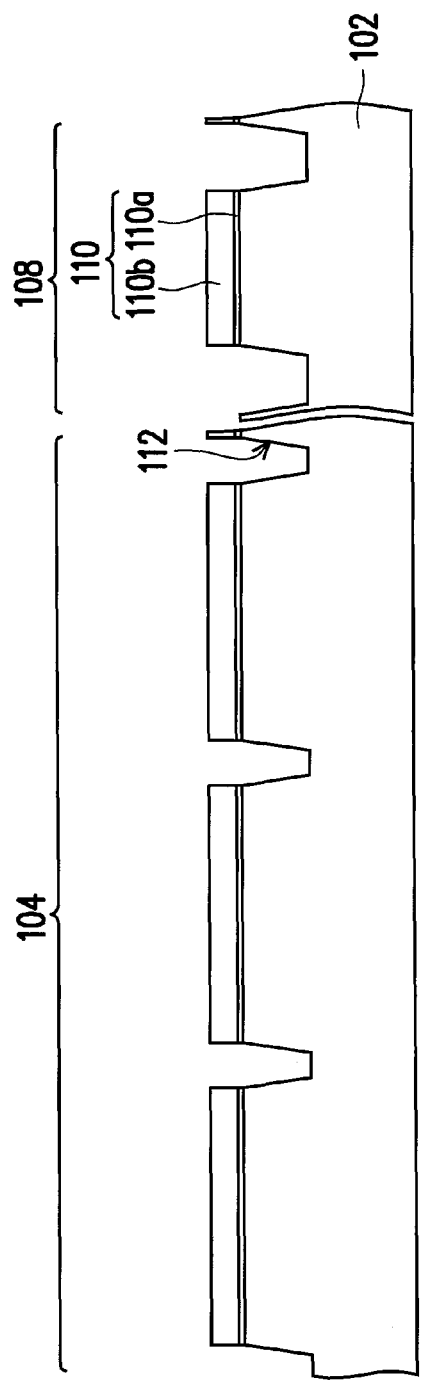

FIG. 1A to FIG. 1F are cross-sectional schematics of the manufacturing method of an image sensor illustrated according to an embodiment of the invention. Referring to FIG. 1A, first, a substrate 102 is provided, wherein the substrate 102 includes a pixel array region 104 and a periphery region 108. The substrate 102 is, for instance, a silicon substrate, and the index of refraction (n) of the substrate 102 is about 4.5.

Then, a plurality of openings 112 is formed in the pixel array region 104 and the periphery region 108 of the substrate 102. Specifically, a patterned mask layer 110 is formed on the substrate 102, and then patterning is performed on the substrate 102 by using the patterned mask layer 110 as a mask to form the plurality of openings 112 in the substrate 102. The patterned mask layer 110 can be a single-layer or a multi-layer structure. In the present embodiment, the patterned mask layer 110 includes, for instance, a first layer 110a and a second layer 110b, wherein the material of each of the first layer 110a and the second layer 110b is, for instance, silicon oxide, silicon nitride, or other suitable materials. The forming method of the patterned mask layer 110 is, for instance, a chemical vapor deposition process or a physical vapor deposition process. The patterning method of the substrate 102 can include a lithography process and an etching process.

Figure 1B:
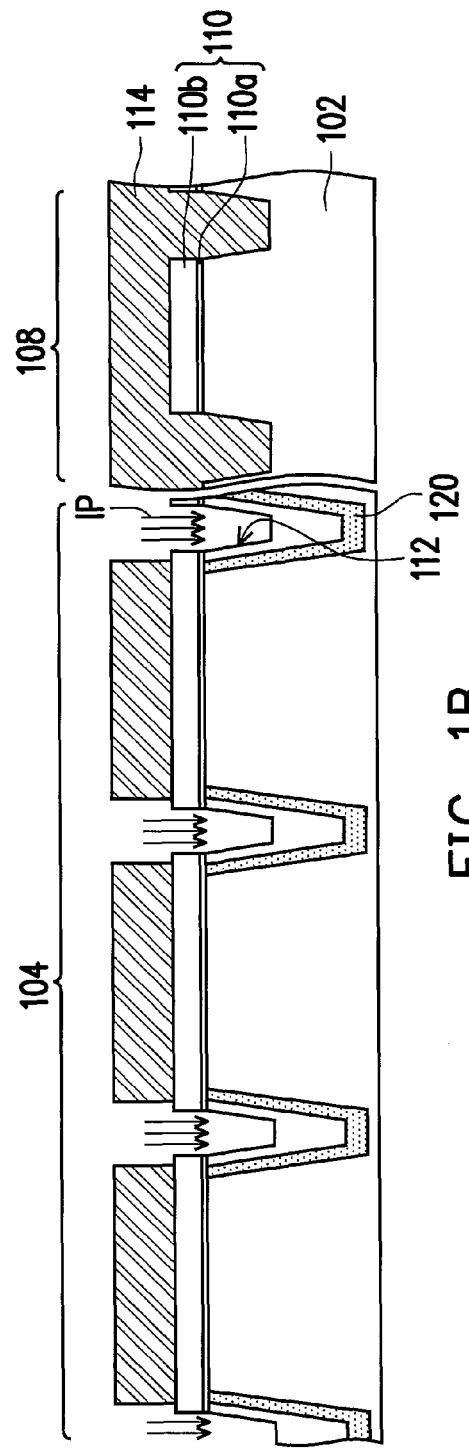

Referring to FIG. 1B, then, a light guide region 120 is formed in the substrate 102 aside each of the openings 112 in the pixel array region 104, wherein a portion of the substrate 102 is disposed between the light guide region 120 and the opening 112. In the present embodiment, the forming method of the light guide region 120 includes, for instance, forming a mask 114 shielding the periphery region 108 on the substrate 102, and then forming the light guide region 120 in the substrate 102 of the pixel array region 104 via an implantation process IP. The implantation process IP can be a separation by implantation of oxygen (SIMOX) method, but is not limited thereto. In the present embodiment, the implantation process IP forms a doped region (i.e., the light guide region 120) in the substrate 102 separated from the opening 112 by a distance, and therefore the light guide region 120 is formed aside the opening 112, and the substrate 102 between the light guide region 120 and the opening 112 remains undoped. The depth of the light guide region 120 in the substrate 102 is greater than the depth of the opening 112 aside the light guide region 120 in the substrate 102. In the present embodiment, the contour of the light guide region 120 is substantially conformal with the contour of the opening 112, but the invention is not limited thereto.

Referring to FIG. 1C, then, after the openings 112 are formed, the mask 114 is removed. Then, isolation structures 130 are formed in the openings 112 to define a plurality of pixel regions 106a, 106b, and 106c respectively located between two adjacent isolation structures 130 in the pixel array region 104. The forming method of the isolation structures 130 includes, for instance, forming, for instance, a material layer of high-density plasma (HDP) oxide on the substrate 102, and then performing a planarization process on the material layer by using the surface of the patterned mask layer 110 as a polishing stop layer, but the invention is not limited thereto. In the present embodiment, after the planarization process is performed, an annealing process is further performed such that the HDP oxide is denser. At the same time, the annealing process activates ions implanted in the light guide region 120. It should be mentioned that, in the present embodiment, to reduce process steps, the annealing process is performed on the light guide region 120 after the isolation structures are formed. However, the invention is not limited thereto, and in other embodiments, after the implantation process IP is performed, the annealing process can also be performed on the light guide region 120 before the isolation structures 130 are formed. In the present embodiment, after the plurality of isolation structures 130 is formed, the patterned mask layer 110 is further removed.

In the present embodiment, the substrate 102 includes silicon having an index of refraction (n) of about 4.5, and after the annealing process is performed, silicon oxide having an index of refraction (n) of about 1.5 is formed in the light guide region 120. Therefore, the index of refraction of the light guide region 120 is less than the index of refraction of the substrate 102 aside the light guide region 120, and a greater difference in index of refraction exists between the light guide region 120 and the substrate 102. In the present embodiment, the light guide region 120 is, for instance, formed in the substrate 102 aside a sidewall and a bottom portion of the isolation structure 130, and the light guide region 120, for instance, continuously surrounds the isolation structure 130, but the invention is not limited thereto. In another embodiment, the light guide region 120 can also be formed in the substrate 102 aside the sidewall of the isolation structure 130, and is not formed in the bottom portion of the isolation structure 130. In other words, the light guide region 120 can also not be continuously formed aside the isolation structure 130, as long as the depth of the light guide region 120 in the substrate 102 exceeds the depth of the isolation structure 130 in the substrate 102. Since the light guide region 120 can be extended below the sidewall of the isolation structure 130, incident light can be prevented from entering the portion not blocked by the isolation structure 130, thus preventing incident light from entering the adjacent pixel regions 106a, 106b, and 106c.

Referring to FIG. 1D, then, gate structures 140 and 150 are formed on the substrate 102 in the pixel regions 106a, 106b, and 106c and the periphery region 108. Then, a photosensitive region 146 and a floating drain region 148 are formed in the substrate 102 at two sides of the gate structure 140, and a source region 156 and a drain region 158 are formed in the substrate 102 at two sides of the gate structure 150. In the present embodiment, the gate structures 140 and 150 are, for instance, formed at the same time. The gate structures 140 and 150 include, for instance, dielectric layers 142 and 152 and conductive layers 144 and 154. The material of each of the dielectric layers 142 and 152 is, for instance, silicon oxide. The material of each of the conductive layers 144 and 154 is, for instance, single-crystal silicon, undoped polysilicon, doped polysilicon, amorphous silicon, metal silicide, or a combination thereof. In the present embodiment, spacers 145 and 155 are further formed on the sidewalls of the gate structures 140 and 150. The material of each of the spacers 145 and 155 is, for instance, silicon oxide, silicon nitride, or a combination of the two. The photosensitive region 146 is a diode doped region including a first conductivity-type doped region 146a and a second conductivity-type doped region 146b, wherein the first conductivity-type and the second conductivity-type are opposite conductivity types. In the case that the substrate 102 is p-type, the first conductivity-type doped region 146a is, for instance, an n-type doped region, the second conductivity-type doped region 146b is, for instance, a p-type doped region, and the floating drain region 148, the source region 156, and the drain region 158 are, for instance, n-type doped regions, and vice versa. In particular, the first conductivity-type doped region 146a is, for instance, a lightly-doped region, and the floating drain region 148, the source region 156, and the drain region 158 are, for instance, heavily-doped regions.

Figure 1E:
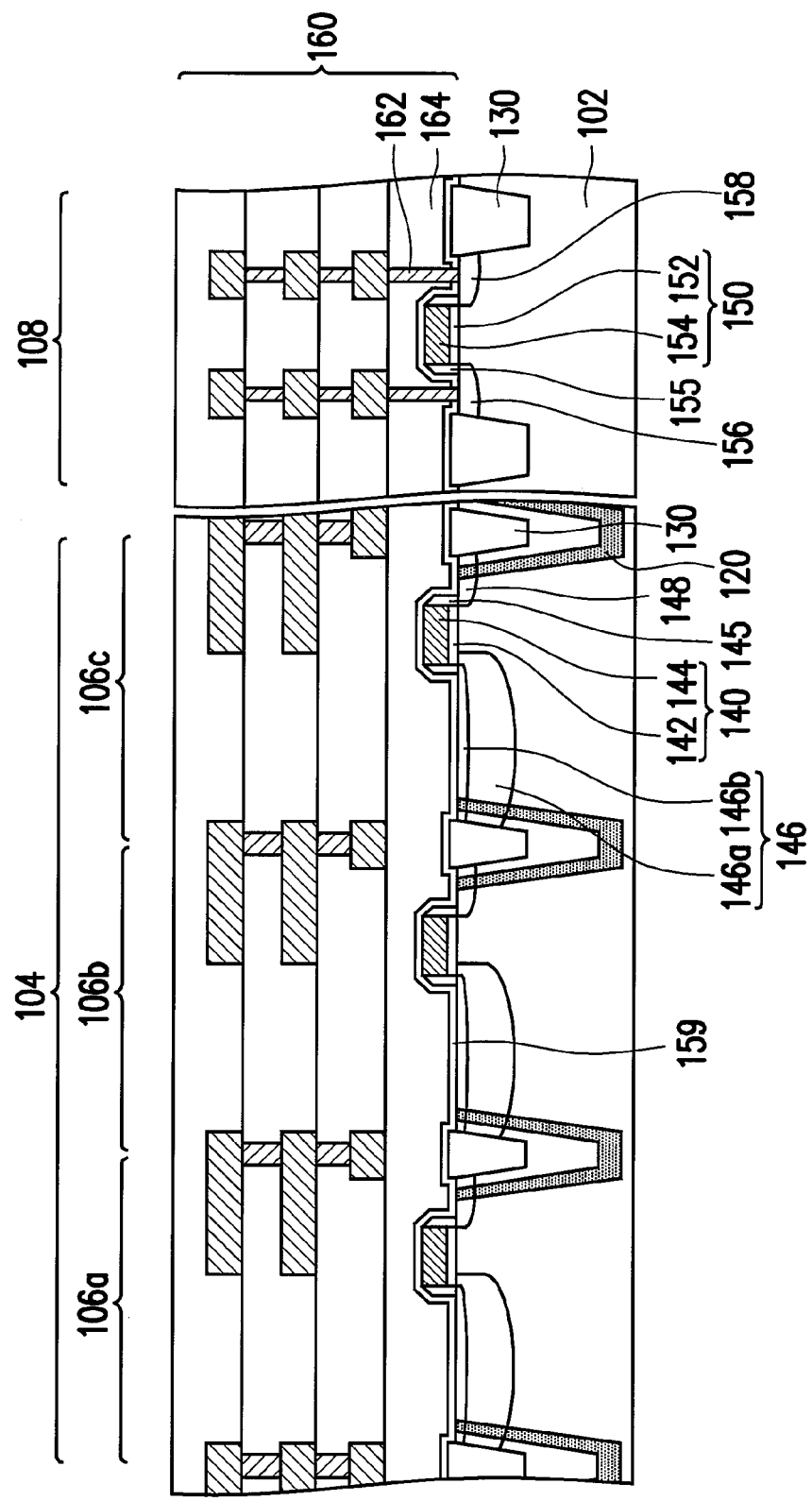

Referring to FIG. 1E, then, a conductive line layer 160 is respectively formed on the substrate 102 in each of the pixel regions 106a, 106b, and 106c and the periphery region 104. The conductive line layer 160 includes, for instance, at least one conductive layer 162 and at least one dielectric layer 164, wherein the conductive layers 162 are formed in the dielectric layers 164. The photosensitive region 146 is, for instance, located between two adjacent conductive line layers 160. In the present embodiment, before the conductive line layer 160 is formed, a contact etching stop layer (CESL) 159 is further formed on the substrate 102, but the invention is not limited thereto. The material of the CESL 159 is, for instance, silicone nitride.

Figure 1F:
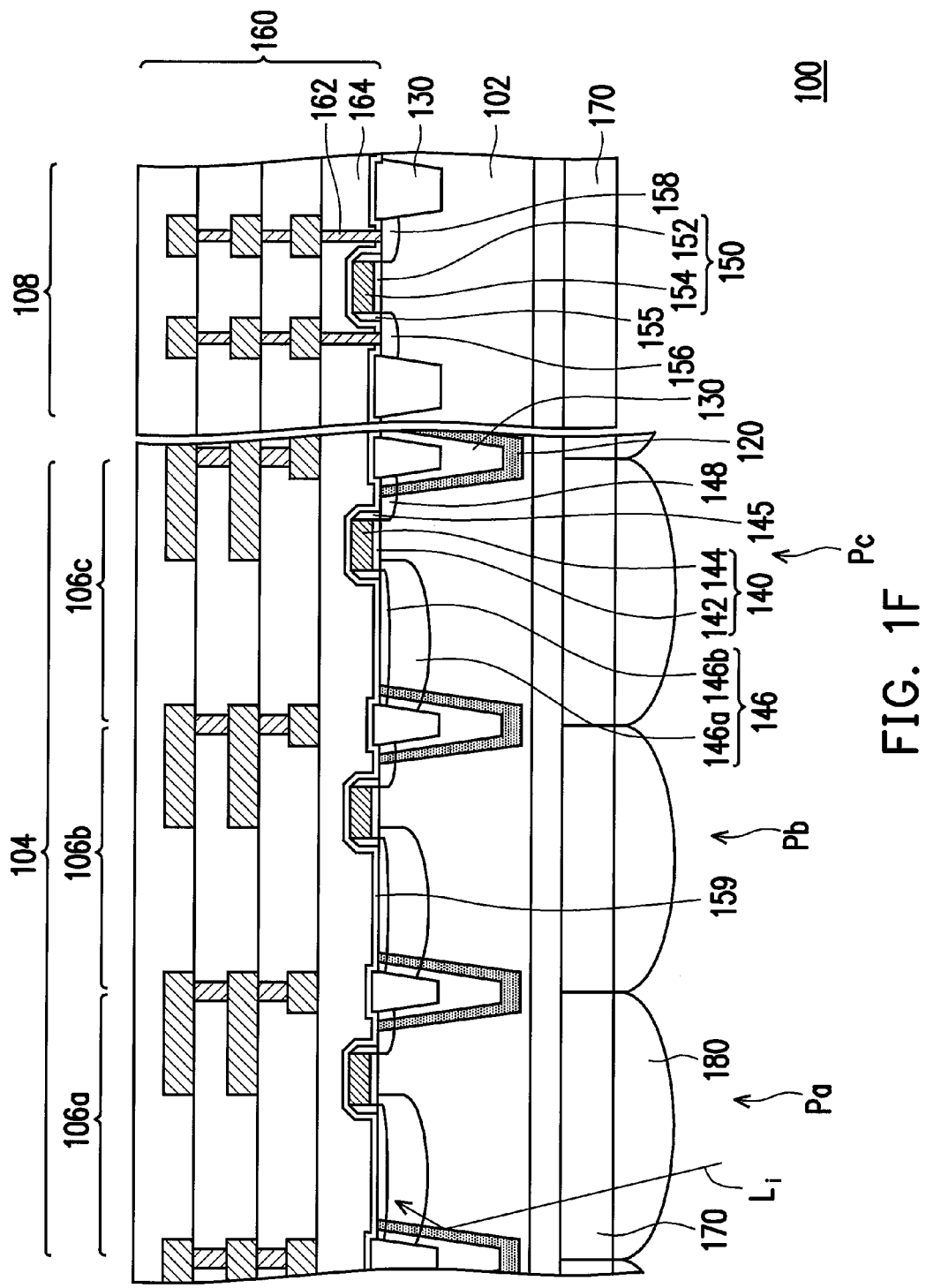
Figure 2:
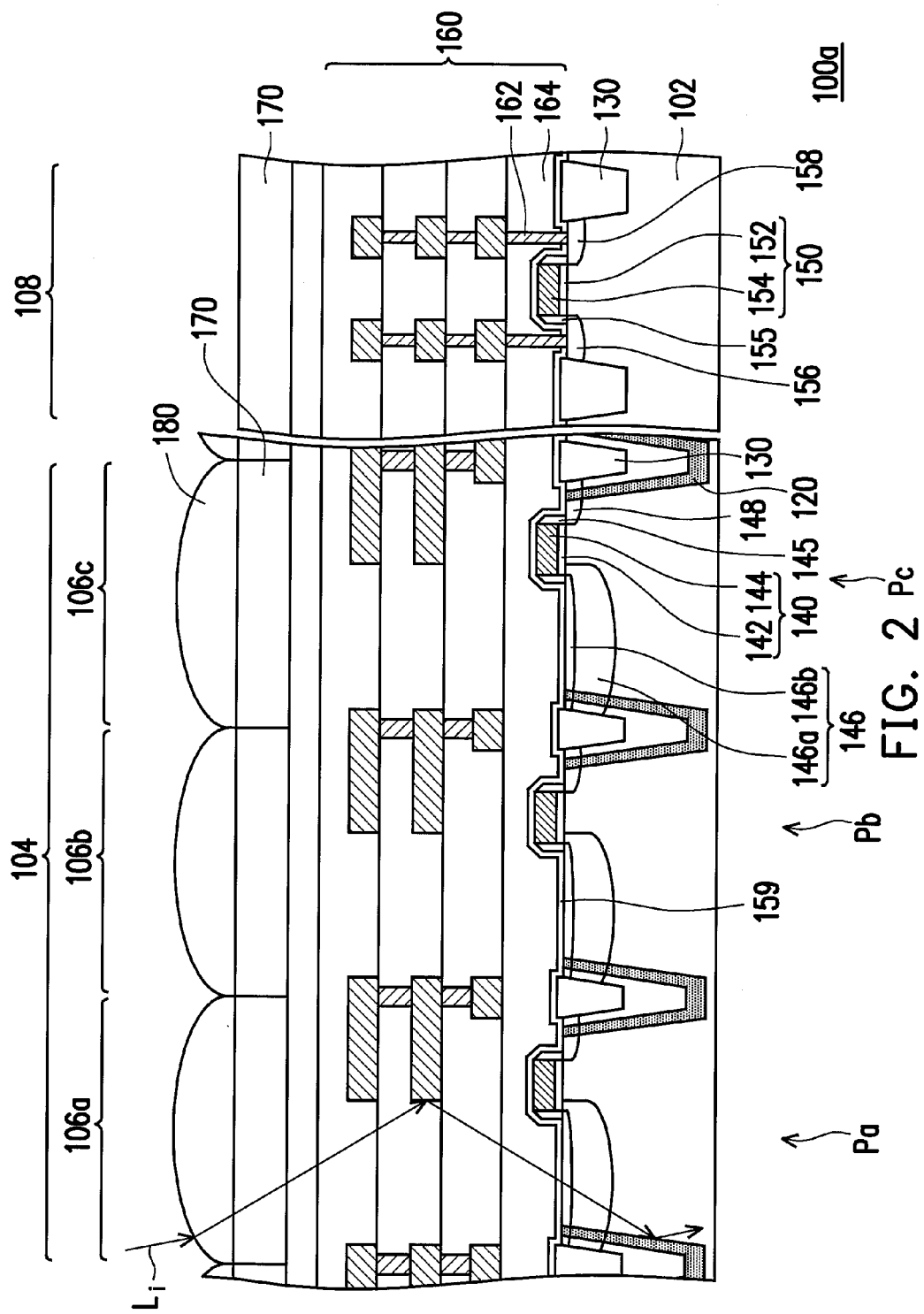
FIG. 2 is a cross-sectional schematic of an image sensor illustrated according to an embodiment of the invention.

Referring to FIG. 1F, then, a filter layer 170 is formed on the conductive line layer 160 of each of the pixel regions 106a, 106b, and 106c to form pixels Pa, Pb, and Pc. In the present embodiment, the image sensor 100 is a backside illuminated (BSI) image sensor, and therefore the filter layer 170 is formed on the bottom surface of the substrate 102 in each of the pixel regions 106a, 106b, and 106c, such that the filter layer 170 and the conductive line layer 160 are located at two opposite sides of the substrate 102. The filter layer 170 is a first color filter layer, a second color filter layer, or a third color filter layer, so as to respectively form the first pixel Pa, the second pixel Pb, or the third pixel Pc. In the present embodiment, the first color filter layer, the second color filter layer, and the third color filter layer are respectively a red filter layer, a green filter layer, and a blue filter layer, but the invention is not limited thereto. In the present embodiment, a microlens 180 is further formed on the filter layer 170 of each of the pixel regions 106a, 106b, and 106c, such that an incident light Li can be more directly guided to the pixel Pa, Pb, or Pc. In another embodiment, as shown in FIG. 2, the image sensor 100a can also be a frontside illuminated (FSI) image sensor, and therefore the filter layer 170 and the substrate 102 are, for instance, located at two opposite sides of the conductive line layer 160.

In the above embodiments, the image sensors 100 and 100a are, for instance, complementary metal-oxide-semiconductor (CMOS) image sensors. Each of the image sensors 100 and 100a include a substrate 102, a plurality of isolation structures 130, a plurality of pixels Pa, Pb, and Pc, and a plurality of light guide regions 120. The substrate 102 includes a pixel array region 104. The isolation structures 130 are located in the substrate 102 and define a plurality of pixel regions 106a, 106b, and 106c respectively located between two adjacent isolation structures 130 in the pixel array region 104. The pixels Pa, Pb, and Pc are located in the pixel regions 106a, 106b, and 106c. Each of the pixels Pa, Pb, and Pc include a photosensitive region 146 and a conductive line layer 160. The light guide region 120 is located in the substrate 120 aside the isolation structure 130, a portion of the substrate 102 is disposed between the light guide region 120 and the isolation structure 130, the depth of the light guide region 120 in the substrate 102 is greater than the depth of the isolation structure 130 aside the light guide region 120 in the substrate 102, and the index of refraction of the light guide region 120 is less than the index of refraction of the substrate 102. As shown in FIG. 1F, in the BSI image sensor 100, the filter layer 170 and the conductive line layer 160 are located at two opposite sides of the substrate 102. As shown in FIG. 2, in the FSI image sensor 100a, the filter layer 170 and the substrate 102 are, for instance, located at two opposite sides of the conductive layer 160.

In the above embodiments, after the openings 112 for the isolation structures are formed, an implantation process IP is performed on the substrate 102, such that the light guide region 120 surrounds each of the isolation structure 130. As shown in FIG. 1F and FIG. 2, since the light guide region 120 has greater depth relative to the isolation structure 130, the light guide region 120 can block the incident light Li entering a portion below the isolation structure 130. Moreover, the index of refraction of the substrate 102 is greater than the index of refraction of the light guide region 120 and a greater difference in index of refraction exists between the two, and therefore when the incident light Li enters the light guide region 120 from the substrate 102, total reflection readily occurs to the incident light Li at the interface between the light guide region 120 and the substrate 102. In other words, the light guide region 120 can be used as a reflecting mirror guiding the incident light Li incident to one of the pixels Pa, Pb, and Pc, so as to prevent the incident light Li from entering the adjacent pixels Pa, Pb, and Pc from the substrate 102 below the isolation structures 130. Therefore, the light guide region 120 allows the incident light Li to be transmitted in the pixels Pa, Pb, or Pc that the incident light Li is incident to, and be received by the corresponding photosensitive region 146, such that the photosensitive region 146 senses the light source and obtains a sensing signal. In other words, the light guide region can be used to isolate the pixels and guide light to reduce optical crosstalk between pixels. As a result, the sensitivity and the quantum efficiency of the pixels are increased, such that the sensor has better spatial resolution and overall sensitivity.

Based on the above, in the invention, the light guide region is formed in the substrate aside each of the isolation structures, and the light guide region is located between the pixels and extended to the substrate deeper than the isolation structure. Since a difference in index of refraction exists between the light guide region and the substrate, total reflection readily occurs to the incident light at the interface between the light guide region and the substrate. In this way, light incident to a pixel can be prevented from entering an adjacent pixel via the substrate below the isolation structure, thus reducing optical crosstalk between the pixels. In other words, the light guide region helps to keep the incident light in the pixel that the light is incident to, and allows the light to enter the corresponding photosensitive region, such that the photosensitive region senses the light source and obtains a sensing signal. Therefore, the disposition of the light guide region can reduce optical crosstalk between the pixels to increase the sensitivity and the quantum efficiency of the pixels, such that the sensor has better spatial resolution and overall sensitivity. Moreover, although an additional forming step (such as a separation by implanted oxygen method) for the light guide region is required, the light guide region can be formed by using the opening and the annealing process for the isolation structure, and therefore the manufacture of the light guide region is compatible with the manufacturing process of the current image sensor. As a result, manufacturing costs or manufacturing time is not significantly increased.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of an image sensor, comprising:
   providing a substrate, wherein the substrate comprises a pixel array region;
   forming a plurality of openings in the pixel array region of the substrate;
   forming a light guide region in the substrate aside each of the openings, wherein a portion of the substrate is disposed between the light guide region and the opening, and a depth of the light guide region in the substrate is greater than a depth of the opening aside the light guide region in the substrate;
   forming a plurality of isolation structures in the openings to define a plurality of pixel regions respectively located between two adjacent isolation structures in the pixel array region;
   forming a photosensitive region in each of the pixel regions of the substrate; and
   forming a conductive line layer on each of the pixel regions of the substrate.

2. The method of claim 1, wherein a method of forming the light guide region comprises a separation by implanted oxygen method.

3. The method of claim 1, wherein the light guide region is formed in the substrate aside a sidewall and a bottom portion of the isolation structure.

4. The method of claim 1, wherein the light guide region is formed in the substrate aside a sidewall of the isolation structure.

5. The method of claim 1, further comprising forming a filter layer on a bottom surface of the substrate in each of the pixel regions, wherein the filter layer and the conductive line layer are located at two opposite sides of the substrate.

6. The method of claim 1, further comprising forming a filter layer on the conductive line layer of each of the pixel regions, wherein the filter layer and the substrate are located at two opposite sides of the conductive line layer.

7. The method of claim 1, wherein the substrate further comprises a periphery region, and the method further comprises shielding the periphery region when an implantation process is performed on the pixel array region to form the light guide regions.

8. The method of claim 1, further comprising forming a gate structure on the substrate in each of the pixel regions, and forming the photosensitive region and a floating drain region in the substrate at two sides of the gate structure.

9. The method of claim 1, wherein the photosensitive region is located between two adjacent conductive line layers.

10. The method of claim 1, wherein an index of refraction of the light guide region is less than an index of refraction of the substrate.

11. An image sensor, comprising:
    a substrate comprising a pixel array region;
    a plurality of isolation structures located in the substrate and defining a plurality of pixel regions respectively located between two adjacent isolation structures in the pixel array region;
    a plurality of pixels respectively located in the pixel regions, wherein each of the pixels comprises:
      a photosensitive region located in the substrate; and
      a conductive line layer located on the substrate; and
    a plurality of light guide regions, wherein each of the light guide regions is located in the substrate aside the isolation structure, a portion of the substrate is disposed between the light guide region and the isolation structure, a depth of the light guide region in the substrate is greater than a depth of the isolation structure aside the light guide region in the substrate, and an index of refraction of the light guide region is less than an index of refraction of the substrate.

12. The image sensor of claim 11, wherein a material of the light guide region comprises silicon oxide.

13. The image sensor of claim 11, wherein the light guide region is located aside a sidewall and a bottom portion of the isolation structure.

14. The image sensor of claim 11, wherein the light guide region is located aside a sidewall of the isolation structure.

15. The image sensor of claim 11, further comprising a filter layer on a bottom surface of the substrate in each of the pixel regions, wherein the filter layer and the conductive line layer are located at two opposite sides of the substrate.

16. The image sensor of claim 11, further comprising a filter layer located on the conductive line layer of each of the pixel regions, wherein the filter layer and the substrate are located at two opposite sides of the conductive line layer.

17. The image sensor of claim 11, wherein the substrate further comprises a periphery region, and the periphery region comprises a plurality of isolation structures.

18. The image sensor of claim 11, further comprising a gate structure located on the substrate in each of the pixel regions, wherein the photosensitive region and a floating drain region are located in the substrate at two sides of the gate structure.

19. The image sensor of claim 11, wherein the photosensitive region is located between two adjacent conductive line layers.

20. The image sensor of claim 11, wherein the conductive line layer comprises at least one conductive layer and at least one dielectric layer.

* * * * *